United States Patent [19]

Matsuoka et al.

[11] Patent Number: 4,997,378
[45] Date of Patent: Mar. 5, 1991

[54] CONTACT

[75] Inventors: Noriyuki Matsuoka; Masaaki Kubo, both of Tokyo, Japan

[73] Assignee: Yamaichi Electric Mfg. Co., Ltd., Tokyo, Japan

[21] Appl. No.: 528,189

[22] Filed: May 24, 1990

[30] Foreign Application Priority Data

May 25, 1989 [JP] Japan .................................. 1-61023

[51] Int. Cl.⁵ .............................................. H01R 9/09
[52] U.S. Cl. ........................................ 439/71; 439/72; 439/82; 439/876
[58] Field of Search ...................... 439/71, 72, 81–83, 439/876

[56] References Cited

U.S. PATENT DOCUMENTS

| 4,359,252 | 11/1982 | Olsson et al. | 439/71 |
| 4,921,430 | 5/1990 | Matsuoka | 439/72 |
| 4,941,832 | 7/1990 | Korsunsky et al. | 439/71 |

Primary Examiner—Paula A. Bradley
Attorney, Agent, or Firm—Wenderoth, Lind & Ponack

[57] ABSTRACT

A contact has a leg portion at one end and a resilient contact element at the other end. The resilient contact element is provided with a mother contact nose, on which an external terminal of an electronic part is to be placed, formed on its free end. A child contact nose is loosely engaged with an outer surface of the mother contact nose so that the child contact nose can be idly moved, and the child contact nose has a contacting surface larger than that of the mother contact nose.

2 Claims, 4 Drawing Sheets

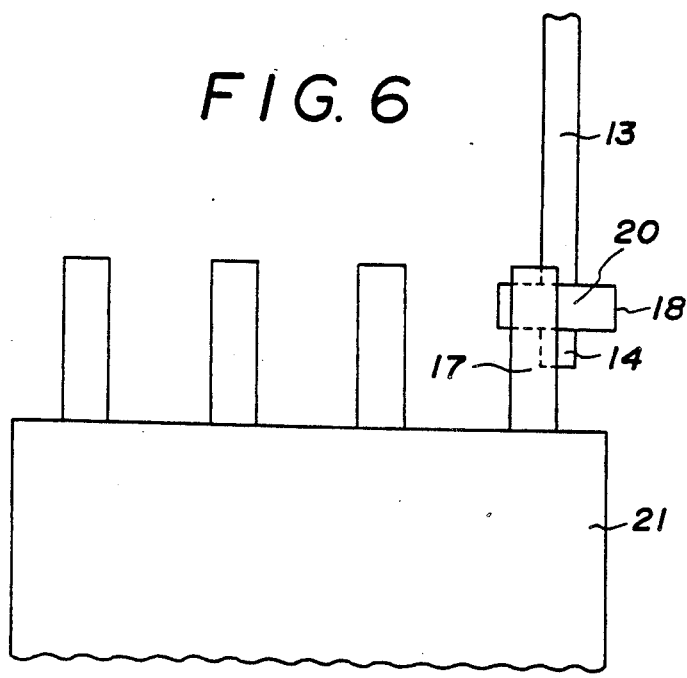
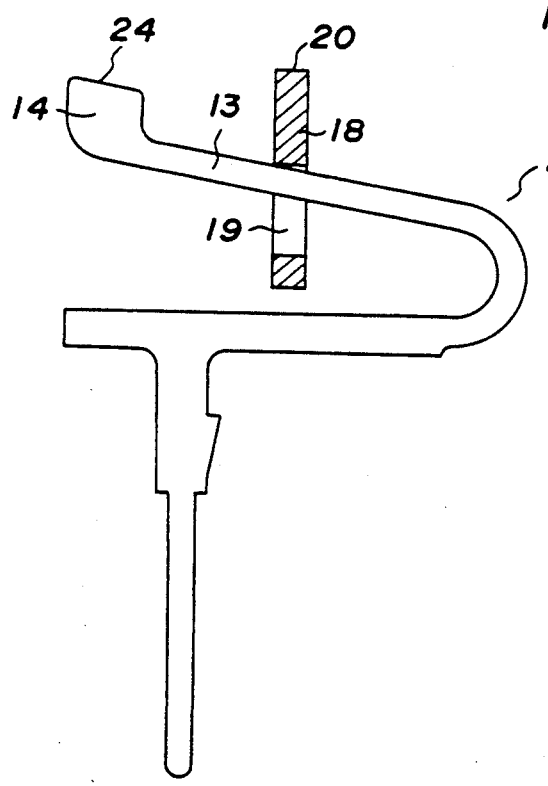
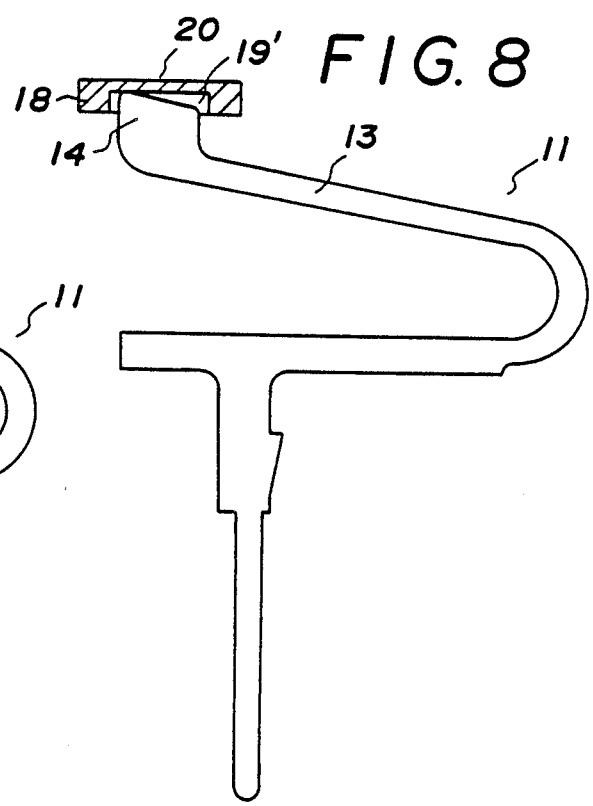

CONTACT

BACKGROUND OF THE INVENTION

1. Field of the Invention

This invention relates to a contact which is to be electrically connected with an external terminal of an electronic part such as IC, etc.

2. Brief Description of the Prior Art

In a socket of IC, etc., a contact, which has on one end thereof a leg portion planted in a socket board and on the other end a resilient contact element bent in a horizontal U-shape and in which the free end of the resilient contact element is provided with a contact nose for placing thereon an external terminal of the IC, and which further has a vertical resiliency, is mostly used.

The contact is formed very thin in correspondence with IC leads arranged in a row at very small pitches, and its contacting area for placing thereon the external terminal is very limited.

When the contact is formed by punching, generation of languishment 3 to the contact nose 2a of the resilient contact element 2, which is to be electrically connected with the IC lead 1, caused by punching is unavoidable as shown in FIG. 1. As a result, as shown by an imaginary line of FIG. 1, when the IC lead 1 is one-sided, there is a fear that no contact is made between the contact nose 2a and the IC lead 1. If the contact is made thick in order to avoid such occurrence, the contact becomes too rigid and an satisfactory resiliency is unobtainable.

SUMMARY OF THE INVENTION

It is therefore a general object of the present invention to provide a contact in which a comparatively large contacting surface area for placing thereon an external terminal of IC can be obtained while maintaining a satisfactory vertical resiliency.

As means for solving the above-mentioned problem, a contact, on which an electronic part is to be placed, is designed such that a child contact nose is loosely engaged with the outer surface of a mother contact nose or a resilient contact member having the mother contact nose on a free end of the resilient contact element in such a manner as that the child contact nose can be idly moved and the child contact nose has a larger contacting area to be electrically connected with an electronic part placed thereon than that of the mother contact nose.

Owing to the above-mentioned construction, an external terminal of the electronic part is placed on the child contact nose and electrically connected with the contact through the child contact nose. A comparatively large contacting area can be made available by the provision of the child contact nose when the electronic part is placed on the contact through the child contact nose, and a satisfactory vertical resiliency of the resilient contact member is also made available through the child contact nose engaged with the outer surface of the resilient contact member. As a result, generation of a noncontact state due to languishment of the mother contact nose can be prevented.

In addition, the child contact nose, when the external terminal of the electronic part is placed thereon, absorbs the inclination, etc. of the external terminal while idly moving relative to the mother contact nose, thereby to attain an intimate electrical connection with the terminal.

BRIEF DESCRIPTION OF THE DRAWINGS

The present invention itself, together with other objects and advantages thereof will be best understood from the following detailed description of the illustrated embodiment when read in conjunction with the accompanying drawings, in which:

FIGS. 2 through 10 show the embodiment of the present invention, wherein:

FIG. 2 is a side view showing a contact with a child contact nose penetrating a mother contact nose, which only the child contact nose is shown in section;

FIG. 3 is an enlarged plan view showing one embodiment where the contact is planted in a base of a socket in order to correctly position the child contact nose;

FIG. 4 is a sectional view thereof;

FIG. 5 is an enlarged sectional view of an electric connecting state between the contact and the external terminal when looked from the front side;

FIG. 6 is a plan view of the electrical connecting state;

FIG. 7 is a side view of the contact with the child contact nose penetrating an resilient contact element in which only the child contact nose is shown in section;

FIG. 8 is a side view of the contact with the child contact nose clowned on the mother contact nose in which only the child contact nose is shown in section;

FIG. 9 is an enlarged plan view of another embodiment where the contact with the child contact nose clowned on the mother contact nose is planted in the base of the socket in order to correctly position the child contact nose;

FIG. 10 is a sectional view thereof.

DETAILED DESCRIPTION OF THE EMBODIMENT

The embodiment of the present invention will be described hereinafter with reference to FIGS. 2 through 10.

Figure 1:
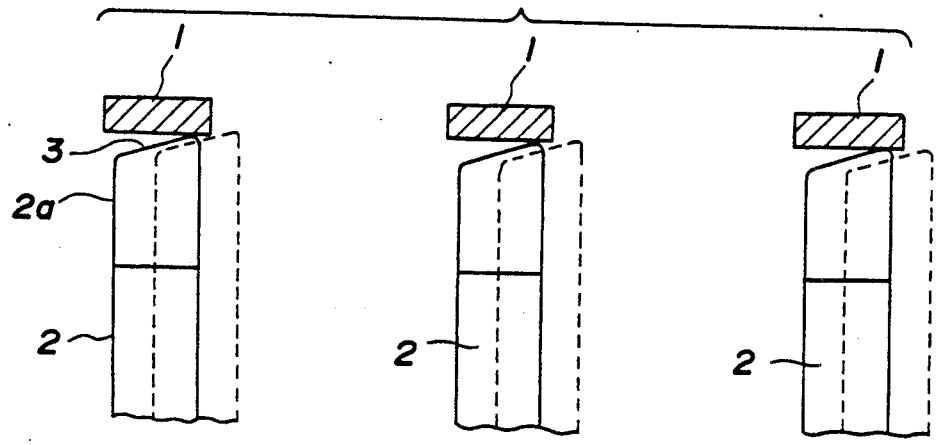
FIG. 1 is an enlarged sectional view of the prior art in which the electrical connecting state between an external terminal of an IC and a contact is seen from the front side.
Figure 2:
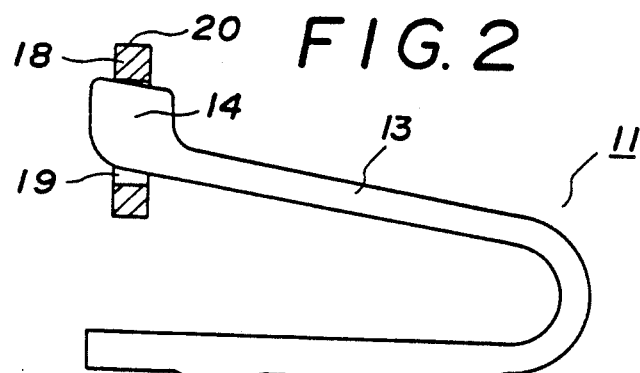

The numeral 11 denotes a contact for electrically connected with an external terminal of an electronic part 21 such as IC, etc. when the electronic part 21 is placed thereon. The contact 11 is provided at one end thereof with a leg portion 12 extending downward and at the other end with a resilient contact element 13 which is bent in a generally horizontal U shape as shown in FIG. 2 and provided with a mother contact nose 14 at a free end thereof so that the resilient contact element 13 has a satisfactory vertical resiliency.

Figure 3:
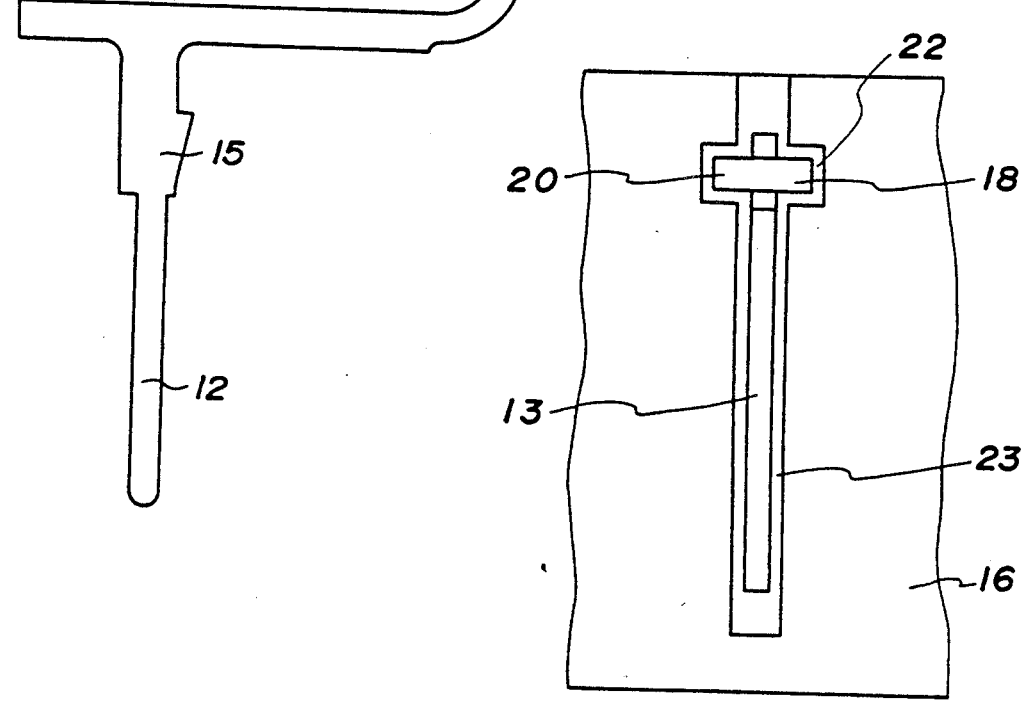
Figure 4:
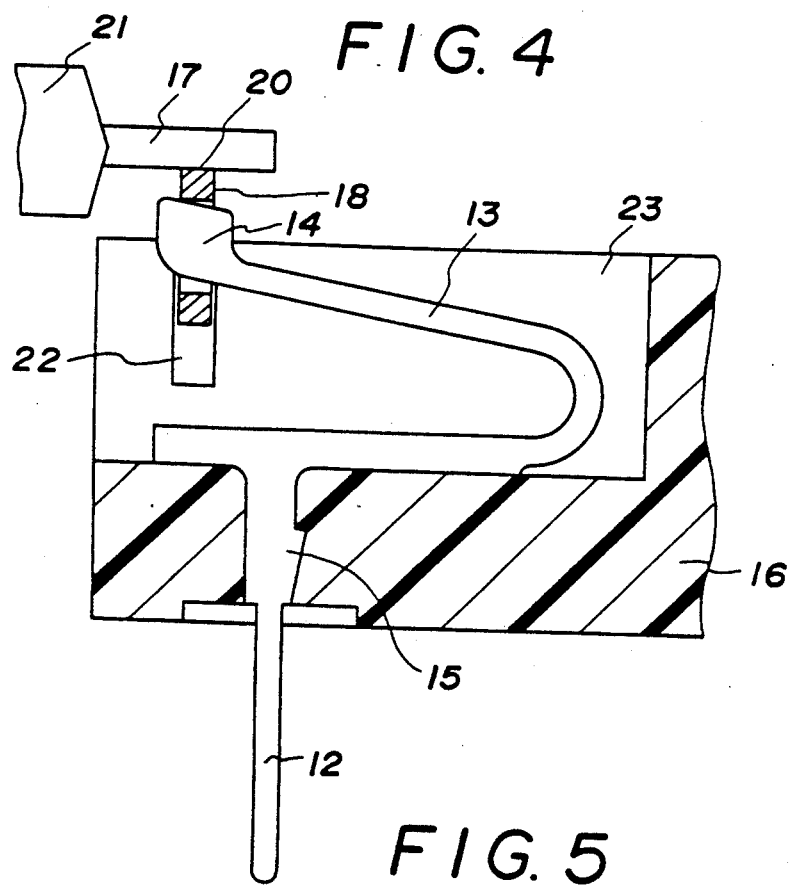
Figure 5:
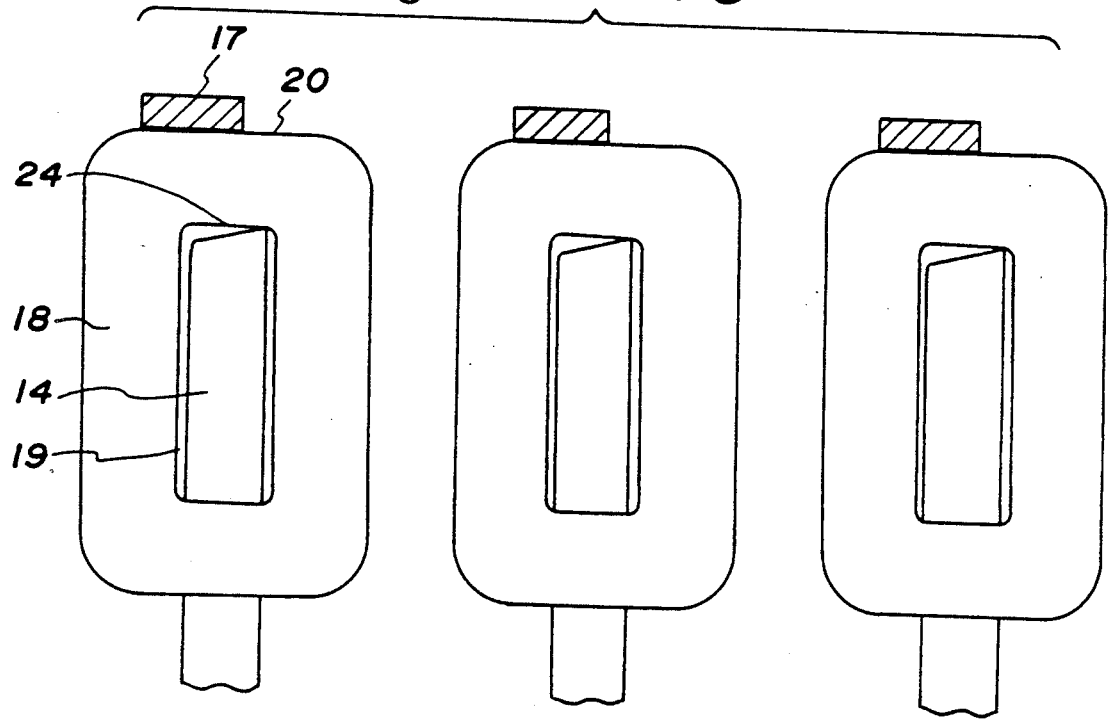

Also, the leg portion 12 is provided with a press-fit nail formed on one end thereof at the connecting portion with the resilient contact element 13 and projecting outward to form a planting portion 15. By planting the planting portion 15 into a base 16 of a socket in the manner as shown in FIGS. 3, 4 and 6, the contacts 11 are arranged in parallel relation at equal pitches so that each of the contacts 11 is electrically connected with an external terminal 17 of an electronic part 21 when placed thereon.

The mother contact nose 14 formed on the free end of the resilient contact element 13 of the contact 11 or the resilient contact element 13 is loosely engaged with its outer surface with a child contact nose 14 in such a manner as that the child contact nose 14 can be idly moved when the electronic part 21 is placed on the contact 11.

FIGS. 2 through 6 depict concrete examples of the child contact nose 18 engaged on the outer surface of the mother contact nose 14 of the resilient contact element 13. In FIGS. 2 through 6, the child contact nose 18 formed of a generally square tiny metal piece having an engaging hole 19 formed in a generally central portion of the tiny metal piece. The child contact nose 18 is loosely engaged with the outer surface of the mother contact nose 14 through the engaging hole 19 so that the child contact nose 18 can be idly moved when engaged. That is, the child contact nose 18 is engaged with the outer surface of the mother contact nose 14 with some play, so that the child contact nose 18 can be inclined in the rotating direction about the mother contact nose 14.

A contacting surface 20 having a larger contacting area than that of a contacting area of the the mother contact nose 14 extending in the arranging direction of the external terminal 17 is formed by an upper side of the child contact nose 18.

As is shown in FIGS. 4 through 8, the external terminal 17 of the electronic part 21 is placed on the contacting surface 20 of the child contact nose 18 and placed on and electrically connected with the mother contact nose 14 through the child contact nose 14. The child contact nose 14 is very slightly inclined in the rotating direction in accordance with a one-sided state of the external terminal 17 while maintaining a contacting area with the external terminal 17, so that a lower surface of the external terminal 17 is intimately contacted with the contacting surface 20.

A lower end of the contact nose 18, as shown in FIGS. 3 and 4, is vertically displaceably inserted into a regulation groove 22 formed in the base 16 of the socket together with the resilient contact member 13 with a play formed therebetween so that the contacting state can be properly adjusted when the external terminal 17 is contacted with the contact nose 18 while maintaining an engaging position and posture with respect to the mother contact nose 14.

The regulation groove 22 is designed such that it is communicated with a regulation groove 23 for receiving the contact 11 and extends across the regulation groove 23.

Next, FIG. 7 shows another example in which the child contact nose 18 is loosely engaged with the outer surface of the resilient contact element 13 of the contact 11 so that the child contact nose 18 can be idly moved.

The child contact nose 18 is engaged with the outer surface of the extending resilient contact element 13 at a desired position, and its contacting position can be desirably established without changing the construction of the contact the position of which is fixed by the mother contact nose 14. In this case, it may be designed that the external terminal 14 is contacted with both the contacting surfaces 20 and 24 of the child and mother contact noses 18 and 14, respectively. The positioning of the contact nose 18 can be made by the same means as in FIGS. 3 and 4.

Next, FIG. 8 shows another example in which the child contact nose 18 is engaged with the outer surface of the mother contact nose 14. As is shown in the drawing, a tiny metal piece is provided with a recess 19' with a bottom formed in a lower surface thereof. The child contact nose 18 is engaged with the outer surface of the mother contact nose 14 through the recess 19' in such a manner as to be clowned on the mother contact nose 14, and an upper surface of the child contact nose 18 is served as a contacting surface 20 for allowing the external terminal 17 to be placed thereon. The child contact nose 18 is inclined in such a manner as to be intimately contacted with the external terminal 17 in accordance with the posture of the external terminal 17 while being supported at the inner bottom surface of the recess 19'.

Figure 9:
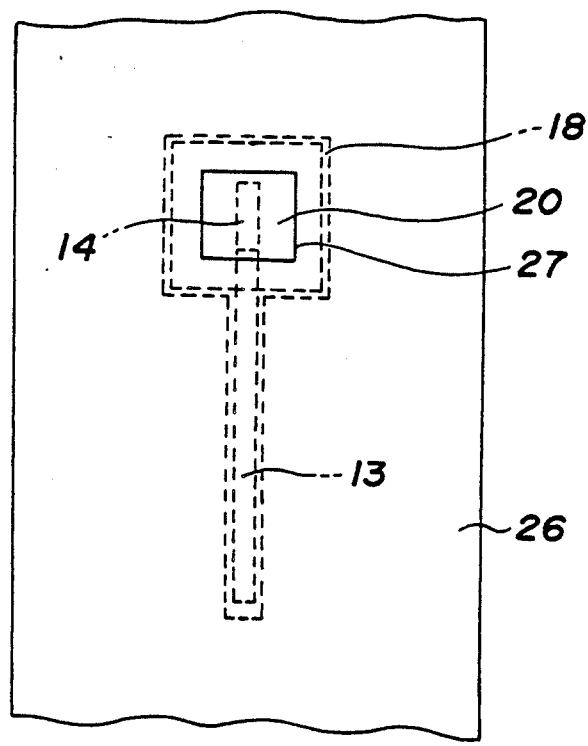
Figure 10:
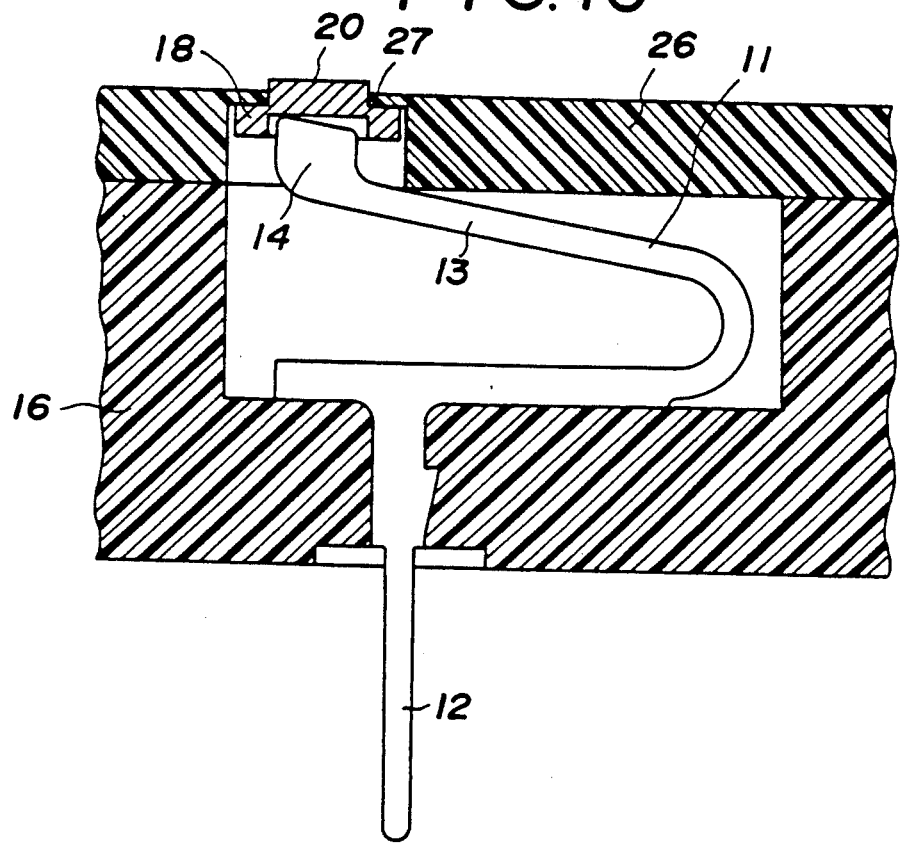

As for means for positioning the child contact nose 18 to the base 16 of the socket, as shown in FIGS. 9 and 10 for example, the edge portion of the child contact nose 18 is supported by a jump-out preventing plate 26 superposed on the base 16 of the socket and the contacting surface 20 projects upwardly from an upper surface of the jump-out preventing plate 26 through a window 27 formed in the jump-out preventing plate 26, so that the child contact nose 18 can be vertically displaced together with the mother contact nose 14.

As described in the foregoing, the external terminal of the electronic part is placed on and electrically connected with the outer surface of the mother contact nose of the contact or the child contact nose which is engaged with the outer surface of the resilient contact element, so that a reliable electrical connection between the contact and the external terminal can be obtained through the child contact nose and, at the same time, a satisfactory large contacting area can be obtained, and furthermore, a favorable vertical resilient effect of the resilient contact element can be obtained through the child contact nose. Accordingly, the problem for generating a noncontacting state with the external contact terminal caused by the languishment generated on the contact surface of the mother contact nose at the time when the mother contact nose is punched out can be effectively and correctly solved. In addition, the child contact nose absorbs the inclination, etc. of the external terminal while idly moving relative to the mother contact nose in order to obtain an intimate electrical connection with the external terminal.

The present invention can easily and correctly solve the problem inherent in the conventional contact merely by having the child contact nose engaged with the outer surface of the contact and without any design change.

Several embodiments of the present invention have been described in detail in the foregoing. However, the present invention is by no means limited to these embodiments. Many variations can be made without departing from the scope of the present invention.

What is claimed is:

1. A contact having a leg portion at one end and a resilient contact element at the other end, said resilient contact element being provided with a mother contact nose, on which an external terminal of an electronic part is to be placed, formed on a free end thereof, wherein a child contact nose is loosely engaged with an outer surface of said mother contact nose so that said child contact nose can be idly moved, and said child contact nose has a contacting surface larger than that of said mother contact nose.

2. A contact as claimed in claim 1, wherein said child contact nose is loosely engaged with the outer surface of said resilient contact element.

* * * * *